(12) United States Patent
Rowell et al.

(10) Patent No.: US 11,486,918 B2
(45) Date of Patent: Nov. 1, 2022

(54) FIXTURE FOR A DEVICE UNDER TEST

(71) Applicant: Rohde & Schwarz GmbH & Co. KG, Munich (DE)

(72) Inventors: Corbett Rowell, Munich (DE); Benoit Derat, Munich (DE); Markus Herbrig, Grafing (DE); Henry Gropp, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/077,271

(22) Filed: Oct. 22, 2020

(65) Prior Publication Data
US 2022/0128610 A1 Apr. 28, 2022

(51) Int. Cl.
*G01R 29/08* (2006.01)

(52) U.S. Cl.
CPC ..... *G01R 29/0878* (2013.01); *G01R 29/0821* (2013.01)

(58) Field of Classification Search
CPC ............ G01R 29/0878; G01R 29/0821; G01R 21/00; G01R 21/04; G01R 21/01; G01R 19/28
See application file for complete search history.

(56) References Cited

U.S. PATENT DOCUMENTS

| | | | | |
|---|---|---|---|---|
| 3,662,260 A | * | 5/1972 | Thomas | G01R 29/24 343/873 |
| 2001/0015702 A1 | | 8/2001 | Hofmann | |
| 2013/0093447 A1 | * | 4/2013 | Nickel | G01R 29/10 324/750.16 |
| 2013/0200913 A1 | * | 8/2013 | Panagas | G06F 3/044 324/756.02 |
| 2013/0259427 A1 | | 10/2013 | Lam et al. | |
| 2020/0244377 A1 | * | 7/2020 | Maruo | H04B 17/3912 |

* cited by examiner

*Primary Examiner* — Jermele M Hollington
*Assistant Examiner* — Suresh K Rajaputra
(74) *Attorney, Agent, or Firm* — Potomac Technology Law, LLC

(57) ABSTRACT

A fixture and a measurement system are provided. The fixture is adapted for electrically connecting a measurement device with a device under test, DUT, in particular a wireless DUT, and for mechanically holding the DUT. The fixture comprises a clamp for clamping the DUT; a male plug for engaging a mating socket of the DUT; and an electrical cable connected to the plug on one end and connectable with the measurement device at its other end. The fixture is arranged to mechanically hold the DUT such that the DUT can be rotated relative to the measurement device. The fixture reduces a shielding effect in respect of antenna modules of the DUT.

13 Claims, 3 Drawing Sheets

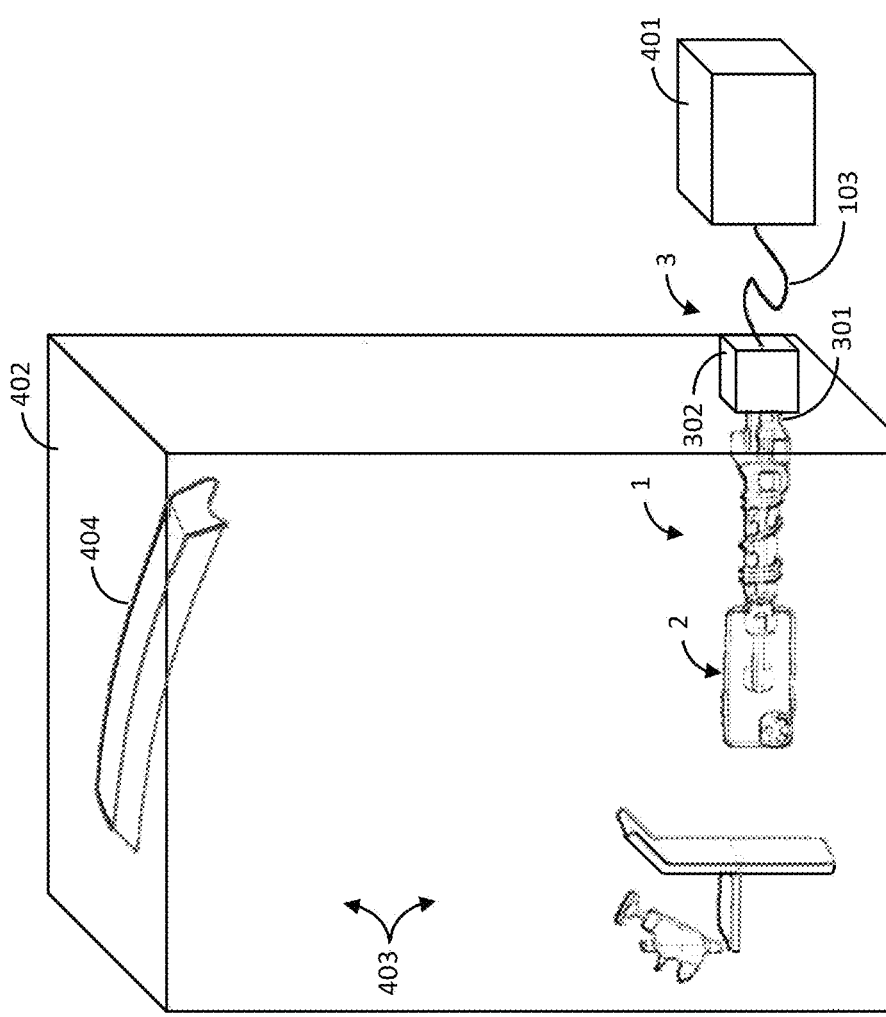

US 11,486,918 B2

FIXTURE FOR A DEVICE UNDER TEST

TECHNICAL FIELD

The present disclosure relates to a fixture for electrically connecting a measurement device with a device under test (DUT) and for mechanically holding the DUT. In particular, the present disclosure relates to a fixture for a wireless DUT.

BACKGROUND

For stability reasons, measurement fixtures for wireless DUTs use a clamping structure around one entire side of the DUT or sandwich the DUT between pieces of foam material. For wireless devices capable of operating in a FR2 millimeter wave (mmWave) range utilized in 5G New Radio (NR), multiple antenna modules are provided all over the DUT in different orientations. Using the above-mentioned fixtures, this means that at least one, and often more, antenna modules are shielded by the fixture, as foam materials are not invisible at higher mmWave frequencies.

There is therefore a need for a fixture which reduces a shielding effect in respect of antenna modules of a DUT.

SUMMARY

Embodiments of the present invention advantageously address the foregoing requirements and needs, as well as others, by providing a fixture which reduces a shielding effect in respect of antenna modules of a device under test (DUT).

The invention is defined by the appended independent claims. Preferred embodiments are set forth in the dependent claims and in the following description and drawings.

According to a first aspect, a fixture is provided. The fixture is adapted for electrically connecting a measurement device with a device under test, DUT, in particular a wireless DUT, and for mechanically holding the DUT. The fixture comprises a clamp for clamping the DUT; a male plug for engaging a mating socket of the DUT; and an electrical cable connected to the plug on one end and connectable with the measurement device at its other end. The fixture is arranged to mechanically hold the DUT such that the DUT can be rotated relative to the measurement device.

Preferably, an axis of rotation of the clamped DUT coincides with a mating direction of the plug.

Preferably, the axis of rotation of the clamped DUT coincides with a longitudinal axis of the clamped DUT.

Preferably, the plug comprises an Universal Serial Bus (USB) plug.

Preferably, the plug is reinforced.

Preferably, the clamp is configured to extend across a portion of a display of the clamped DUT.

Preferably, the clamp is made from an RF radiation absorbing plastic.

Preferably, the fixture further comprises a rotating positioner being configured to rotate the clamp about the axis of rotation.

Preferably, the rotating positioner comprises a single-axis positioner.

Preferably, the rotating positioner comprises a drive shaft; and an electrical drive being arranged remotely from the fixture and being configured to drive the rotating positioner via the drive shaft.

Preferably, the fixture further comprises an energy chain being configured to spirally wind around the drive shaft and to enclose at least a portion of the electrical cable being routed outside of the drive shaft.

Preferably, the electrical cable is routed axially within a stationary portion of the fixture.

According to a second aspect, a measurement system is provided for measuring a DUT. The measurement system comprises a measurement device for measuring a radio property of the DUT; and a shielded chamber. The shielded chamber comprises the DUT; a fixture according to the first aspect or any of its embodiments mechanically holding the DUT and electrically connecting the DUT with the measurement device; and a number of antennas for effecting or acquiring the radio property of the DUT.

Preferably, the number of antennas comprises a compact antenna test range system having a reflector.

Alternatively, the number of antennas comprises a plurality of antennas.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Further aspects, advantages and objects of the invention will become evident for the skilled reader by means of the following detailed description of the embodiments of the invention, when taking into conjunction with the figures of the enclosed drawings.

FIG. 4 illustrates a measurement system according to an embodiment of the present invention.

DETAILED DESCRIPTION

A fixture which reduces a shielding effect in respect of antenna modules of a device under test (DUT) is provided. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

The invention will now be described with respect to various embodiments. The features of these embodiments may be combined with each other unless specified otherwise.

Figure 1:
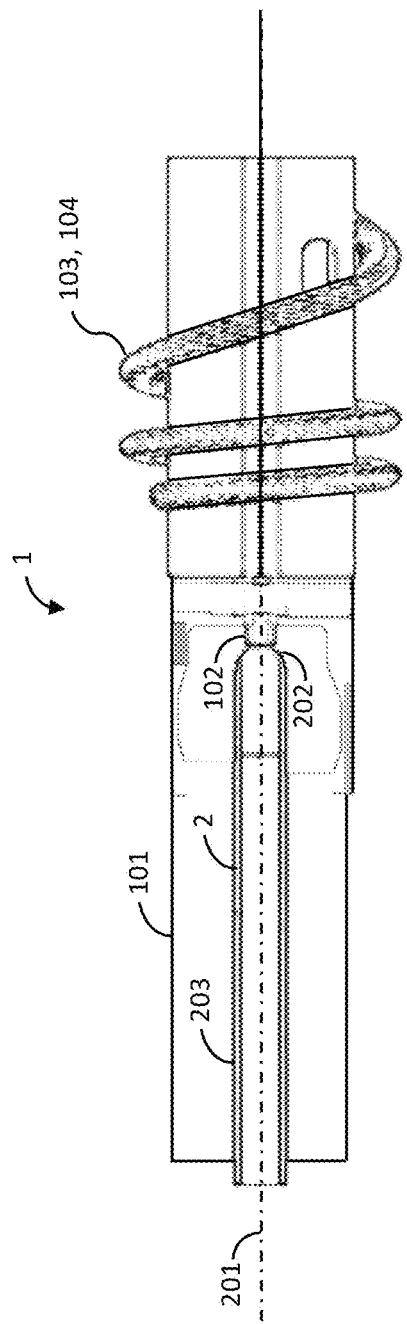
FIG. 1 illustrates a fixture according to an embodiment of the present invention.

FIG. 1 illustrates a fixture 1 according to an embodiment of the present disclosure.

As used herein, the term "fixture" may refer to a device being configured to support and fix a physical object in position.

The fixture 1 is adapted for electrically connecting a measurement device 401 (shown in FIG. 4) with a device under test, DUT 2, in particular a wireless DUT, and for mechanically holding the DUT 2. The DUT 2 may comprise a wire-bound data/power socket 202 in a socket portion thereof and a display 203.

The fixture 1 comprises a clamp 101, a male plug 102, and an electrical cable 103. The clamp 101 is for clamping the DUT 2, the male plug 102 for engaging a mating socket 202 of the DUT 2; and the electrical cable 103 is connectable or connected to the plug 102 on one end and connectable with the measurement device 401 at its other end.

As used herein, the term "clamp" may refer to a device being configured to constrict or press a physical object so as to hold it firmly.

The fixture 1 is arranged to mechanically hold the DUT 2 such that the DUT 2 can be rotated relative to the measurement device 401.

Based on industry knowledge, the socket portion of a typical wireless DUT 2 includes the data/power socket 202 and a sub-6 GHz antenna. Thus, clamping the DUT 2 in a vicinity of its the data/power socket 202 would not interfere unduly with radio measurements in FR2 mmWave frequencies above 6 GHz.

As used herein, the term "Frequency Range 2" (FR2) may refer to a frequency band from 24.25 GHz to 52.6 GHz being utilized in 5G NR.

When the male plug 102 of the fixture 1 engages the mating socket 202 of the clamped DUT 2, the socket 202 electrically connects the DUT 2 to the measurement device 401 and mechanically stabilizes the clamped DUT 2 as well. Accordingly, the data/power connect is used as mechanical stability point, which enables fixing the DUT 2 using the data/power connect and the clamp 101 only, and thus doing so in sections of the DUT 2 which do not interfere unduly with radio measurements in FR2 mmWave frequencies above 6 GHz. This reduces a shielding effect in respect of antenna modules of the DUT 2.

With reference to FIG. 1, an axis of rotation 201 of the clamped DUT 2 preferably coincides with a mating direction of the plug 102, and/or with a longitudinal axis of the clamped DUT 2. This keeps a rotating mass of the DUT 2 as small as possible, and may reduce a rotating mass of the clamp 101 as well, because the clamp 101 is preferably designed in accordance with requirements given by the DUT 2.

Figure 2:
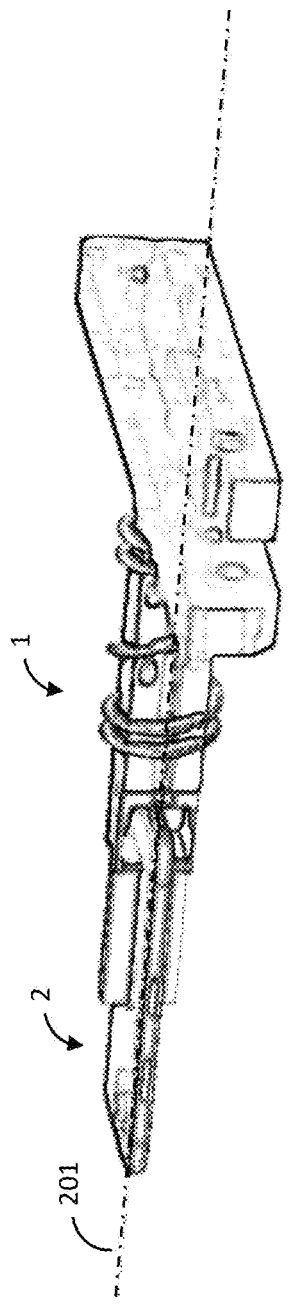
FIGS. 2 and 3 illustrate the fixture of FIG. 1 with a clamped DUT arranged in different orientations in regard of the axis of rotation of the clamped DUT.
Figure 3:
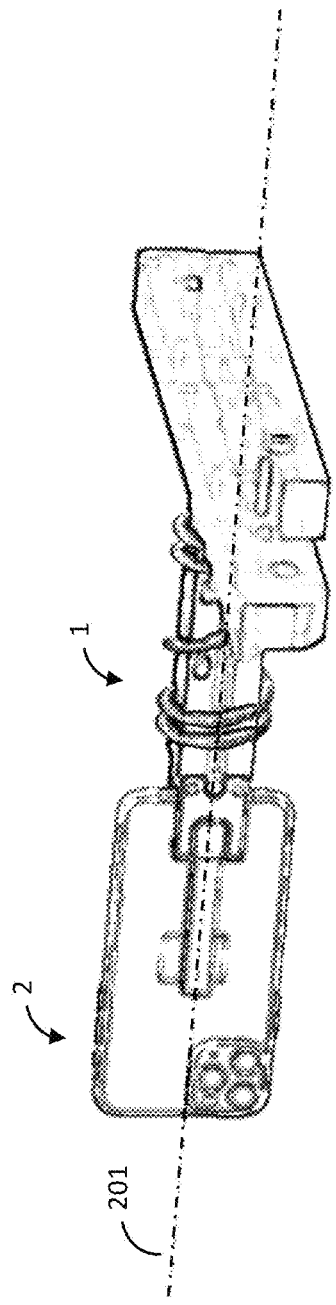

FIGS. 2 and 3 illustrate the fixture 1 of FIG. 1 with a clamped DUT 2 arranged in different orientations in regard of the axis of rotation 201 of the clamped DUT 2.

FIG. 2 shows the clamped DUT 2 in a substantially horizontal orientation from a point of view, whereas FIG. 3 depicts the clamped DUT 2 in a substantially vertical orientation from the same point of view. These orientations merely exemplify that the clamp 101 and the clamped DUT 2 may assume any orientation in accordance with a rotation about the axis of rotation 201 of the clamped DUT 2.

Returning to FIG. 1, the plug 102 of the fixture 1 preferably comprises an USB plug. This complies with statutory requirements in respect of the data/power socket 202 of the DUT 2, and is cost-efficient.

Preferably, the plug 102 of the fixture 1 is reinforced. For example, the plug 102 may comprise extra plastic, and/or may include shape-stable metallic contacts. This further stabilizes the clamped DUT 2 and reduces wear-out of the plug 102.

As shown in FIG. 1, the clamp 101 is preferably configured to extend across a portion of a display 203 of the clamped DUT 2, which is typically embedded in a flat face of the DUT 2. The planar surface of the display 203 (and its flipside) facilitates a secure clamping of the DUT 2, and does not interfere unduly with radio measurements in FR2 mmWave frequencies either.

Preferably, the clamp 101 is made from an RF radiation absorbing plastic. This reduces radiation reflected by the clamp 101, and an influence thereof on the measurement.

Within a stationary portion of the fixture 1, the electrical cable 103 is preferably routed axially. However, as may be taken from FIG. 1, at least a portion of the electrical cable 103 is routed outside of and spirally winds around the stationary portion of the fixture 1. This absorbs a twist induced by a rotating DUT 2 and clamp 101.

FIG. 1 shows that the fixture 1 may further comprise an energy chain 104. The energy chain 104 is configured to spirally wind around a drive shaft 301 (see FIG. 4) of the fixture 1 and to enclose the portion of the electrical cable 103 that is routed outside of the stationary portion of the fixture 1 guiding the drive shaft 301. This increases a service life of the electrical cable 103 and reduces a downtime of measurement systems including the fixture 1.

FIG. 4 illustrates a measurement system 1 according to an embodiment of the present disclosure.

The measurement system 4 is for measuring a DUT 2 and comprises a measurement device 401 and a shielded chamber 402. The measurement device 401 is for measuring a radio property of the DUT 2. The shielded chamber 402 comprises the DUT 2; a fixture 1 according to the first aspect of the present disclosure or any of its embodiments, and a number of antennas 403 for effecting or acquiring the radio property of the DUT 2.

As used herein, the term "radio property" may refer to radiation or scattering characteristics of an antenna over a range of frequencies and/or over a range of orientations of the antenna with respect to a complementing antenna of a test setup.

The fixture 1 mechanically holds the DUT 2 and electrically connects the DUT 2 with the measurement device 401 by engaging the mating socket 202 of the DUT 2 with the male plug 102, so that the electrical cable 103 is connected to the plug 102 on one end and connectable with the measurement device 401 at its other end.

The fixture 1 of FIG. 4 further comprises a rotating positioner 3 being configured to rotate the clamp 101 about the axis of rotation 201. The rotating positioner 3 preferably comprises a single-axis positioner, a drive shaft 301 passing through the stationary portion of the fixture 1, and an electrical drive 302.

The electrical drive 302 is preferably arranged remotely from the fixture 1, i.e., outside of the shielded chamber 402, to save space and reduce electromagnetic interference (EMI). The electrical drive 302 is configured to drive the rotating positioner 3 via the drive shaft 301, in order to vary an orientation of the clamp 101 and the clamped DUT 2 as exemplified in FIGS. 2 and 3 above for measuring the DUT 2 in different orientations in respect of the number of antennas 403.

FIG. 4 illustrates an embodiment wherein the number of antennas 403 comprises a compact antenna test range (CATR) system having a reflector 404.

As used herein, a CATR system may refer to an indoor test setup capable of measuring an antenna of a DUT over a range of frequencies and/or over a range of orientations of the antenna with respect to a complementing antenna of the test setup.

Alternatively or additionally, the number of antennas 403 may comprise a plurality of antennas, e.g. for measuring a radio property of the DUT 2 in connection with a multiple-input, multiple-output (MIMO) radio communication.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A fixture adapted to electrically connect a measurement device with a device under test (DUT) and to mechanically hold the DUT, the fixture comprising:
    a clamp adapted to clamp the DUT;
    a plug adapted to engage a mating socket of the DUT; and
    an electrical cable adapted to connect to the plug at one end and to be connectable with the measurement device at another end; and
    wherein the fixture is adapted to mechanically hold the DUT such that the DUT can be rotated relative to the measurement device,
    wherein an axis of rotation of the clamped DUT coincides with a mating direction of the plug and with a longitudinal axis of the clamped DUT.

2. The fixture of claim 1, wherein the plug comprises a Universal Serial Bus (USB) plug.

3. The fixture of claim 1, wherein the plug is reinforced.

4. The fixture of claim 1, wherein the clamp is configured to extend across a portion of a display of the clamped DUT.

5. The fixture of claim 1, wherein the clamp is composed of a radio frequency (RF) radiation absorbing plastic.

6. The fixture of claim 1, further comprising:
    a rotating positioner configured to rotate the clamp about an axis of rotation.

7. The fixture of claim 6, wherein the rotating positioner comprises a single-axis positioner.

8. The fixture of claim 6, wherein the rotating positioner comprises a drive shaft and an electrical drive arranged remotely from the fixture and configured to drive the rotating positioner via the drive shaft.

9. The fixture of claim 1, wherein the fixture further comprises:
    an energy chain configured to spirally wind around the drive shaft and to enclose at least a portion of the electrical cable being routed outside of the drive shaft.

10. The fixture of claim 9, wherein the electrical cable is routed axially within a stationary portion of the fixture.

11. A measurement system for measuring a device under test (DUT), comprising:
    a measurement device adapted to measure a radio property of the DUT; and
    a shielded chamber adapted to house the DUT, wherein the shielded chamber comprises:
        (i) a fixture adapted to electrically connect the measurement device with the DUT and to mechanically hold the DUT, wherein the fixture comprises a clamp adapted to clamp the DUT, a plug adapted to engage a mating socket of the DUT, (ii) an electrical cable adapted to connect to the plug at one end and to be connectable with the measurement device at another end, and (iii) a number of antennas adapted to receive or acquire the radio property of the DUT; and
    wherein the fixture is adapted to mechanically hold the DUT such that the DUT can be rotated relative to the measurement device, and
    wherein an axis of rotation of the DUT coincides with a mating direction of the plug and with a longitudinal axis of the DUT.

12. The measurement system of claim 11, wherein the number of antennas comprises a compact antenna test range (CATR) system having a reflector.

13. The measurement system of claim 11, wherein the number of antennas comprises a plurality of antennas.

* * * * *